US007415916B2

(12) United States Patent  (10) Patent No.: US 7,415,916 B2
Lindsey, Jr.  (45) Date of Patent: Aug. 26, 2008

(54) SCRIBING SYSTEM WITH PARTICLE REMOVER

(75) Inventor: Paul C. Lindsey, Jr., Lafayette, CA (US)

(73) Assignee: Micro Processing Technology, Inc., Lafayette, CA (US)

( * ) Notice: Subject to any disclaimer, the term of this patent is extended or adjusted under 35 U.S.C. 154(b) by 89 days.

(21) Appl. No.: 11/326,204

(22) Filed: Jan. 5, 2006

(65) Prior Publication Data

US 2006/0162173 A1  Jul. 27, 2006

Related U.S. Application Data

(63) Continuation-in-part of application No. 11/041,841, filed on Jan. 24, 2005.

(51) Int. Cl.
*B26D 3/08* (2006.01)

(52) U.S. Cl. ............................. 83/880; 83/879; 83/886; 83/663; 83/676

(58) Field of Classification Search ............ 83/880, 83/879, 887, 886, 884, 665, 663, 676; 225/94–96; 438/460

See application file for complete search history.

(56) References Cited

U.S. PATENT DOCUMENTS

| | | | |
|---|---|---|---|
| 3,094,785 A | | 6/1963 | Kulicke |
| 3,968,712 A | * | 7/1976 | Duncan ..................... 83/477.2 |
| 4,221,150 A | | 9/1980 | Bergfelt et al. |
| 4,228,711 A | * | 10/1980 | Insolio ....................... 83/881 |
| 4,383,460 A | * | 5/1983 | Schotter et al. ............... 83/886 |
| 5,304,056 A | * | 4/1994 | Fetterhoff .................. 425/304 |
| 5,331,877 A | * | 7/1994 | Ishii ........................... 83/886 |
| 5,718,615 A | * | 2/1998 | Boucher et al. ................ 451/5 |
| 5,820,006 A | | 10/1998 | Turner |
| 6,238,280 B1 | * | 5/2001 | Ritt et al. .................... 451/540 |
| 6,595,845 B1 | * | 7/2003 | Mizuno et al. ............. 451/548 |
| 6,679,243 B2 | * | 1/2004 | Sung .......................... 125/12 |
| 6,722,545 B2 | * | 4/2004 | Yuyama et al. ............ 225/96.5 |
| 6,796,212 B2 | * | 9/2004 | Maekawa et al. ............. 83/886 |

\* cited by examiner

*Primary Examiner*—Boyer D. Ashley
*Assistant Examiner*—Omar Flores-Sánchez
(74) *Attorney, Agent, or Firm*—Thomas R. Lampe

(57) ABSTRACT

Particle removal structure is employed with a scribing tool to remove particles from the surface of a semiconductor wafer being scribed and transport the particles to another location.

9 Claims, 5 Drawing Sheets

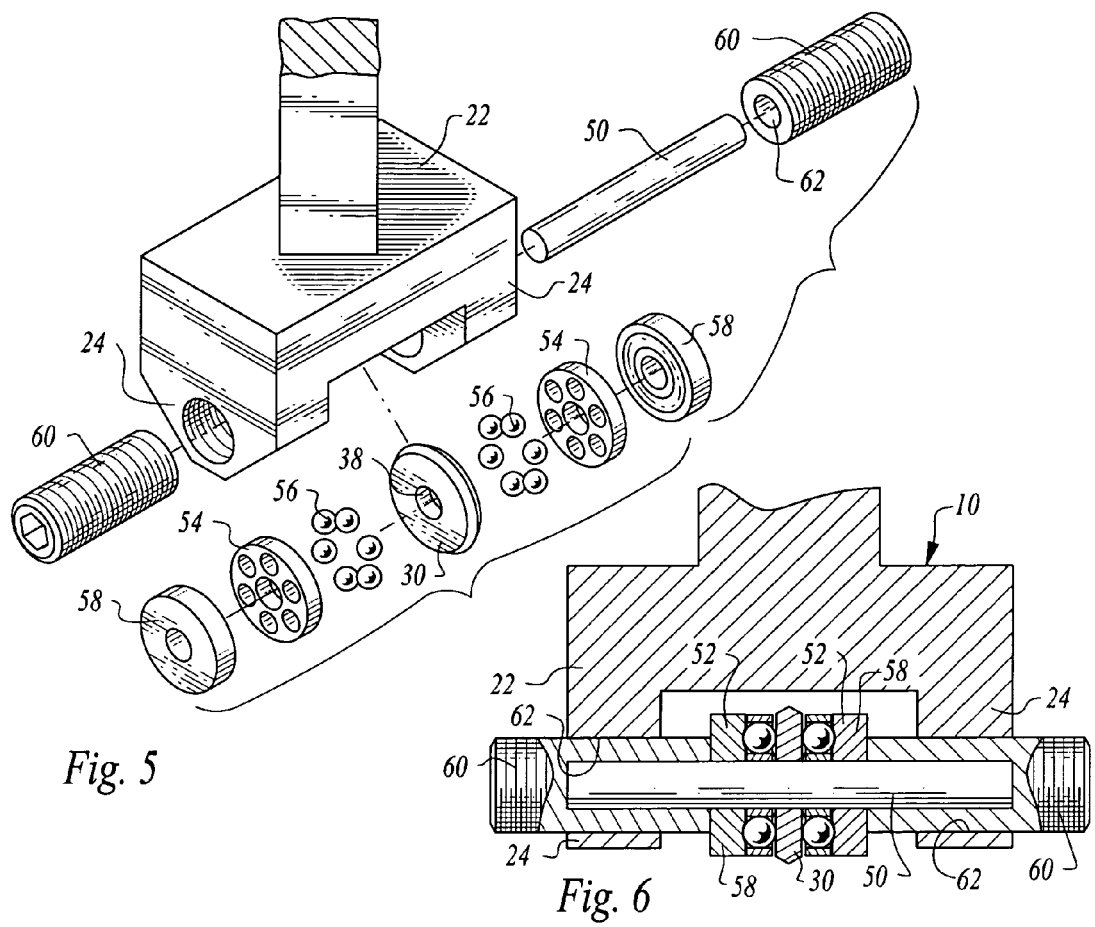
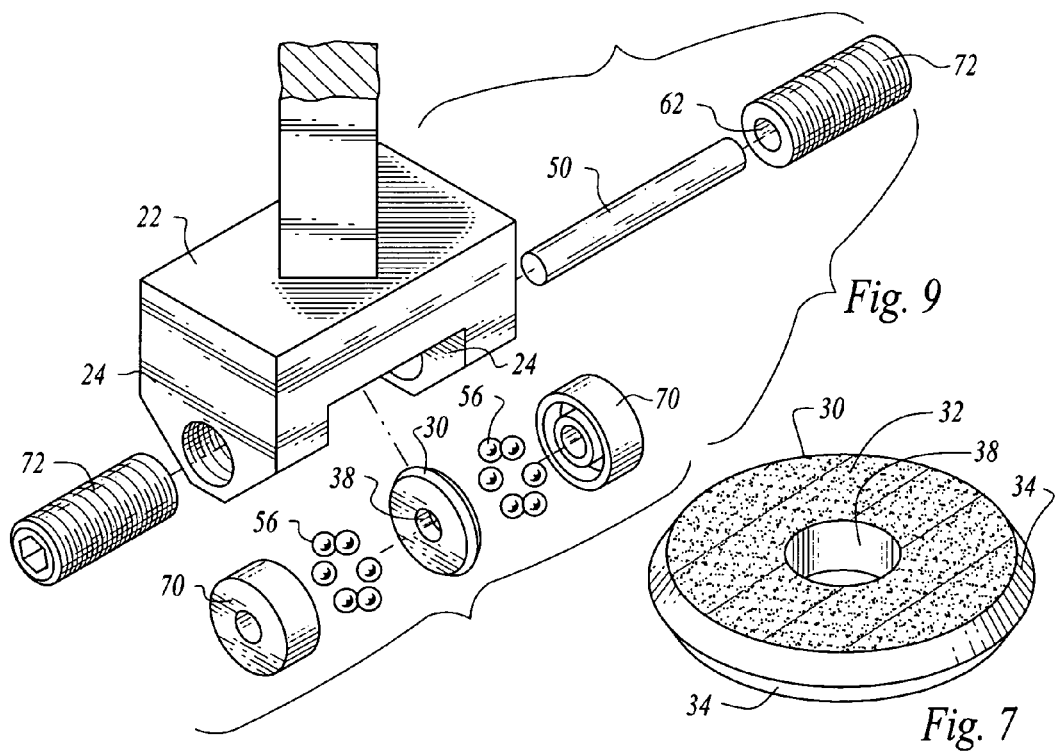

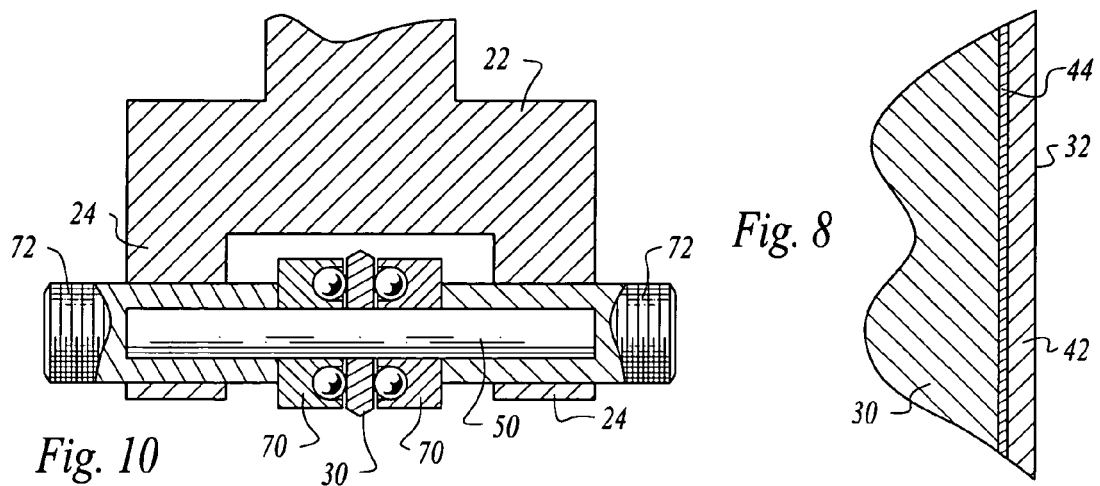
Fig. 8
Fig. 10
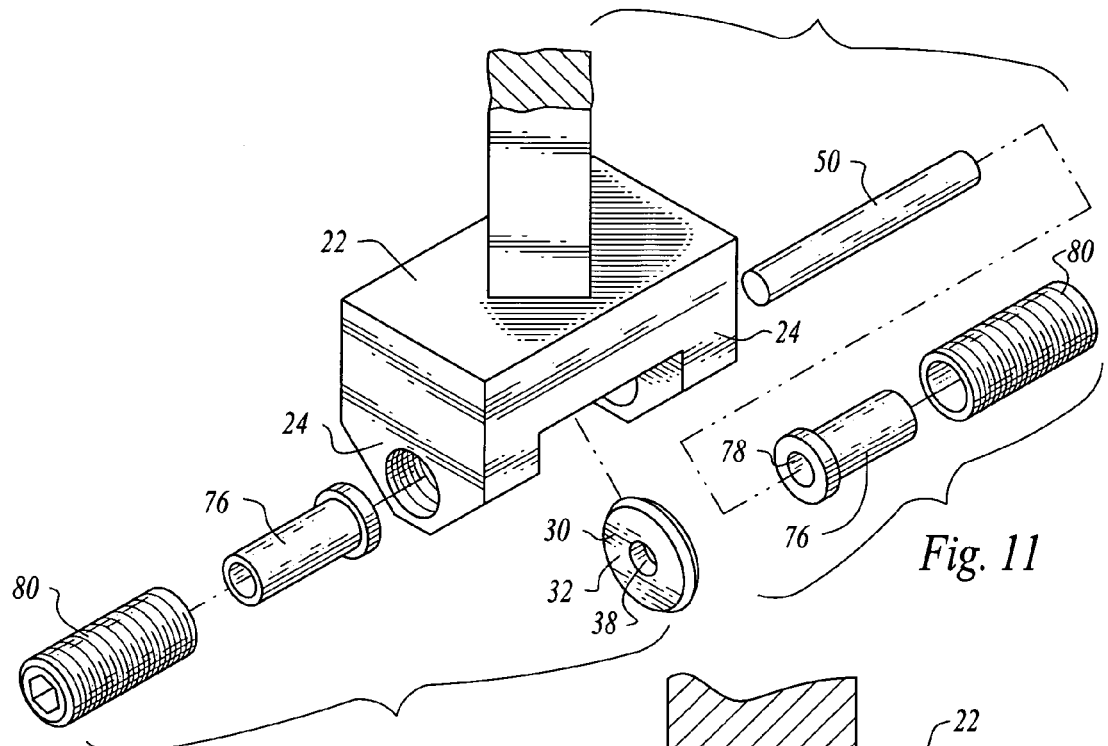
Fig. 11
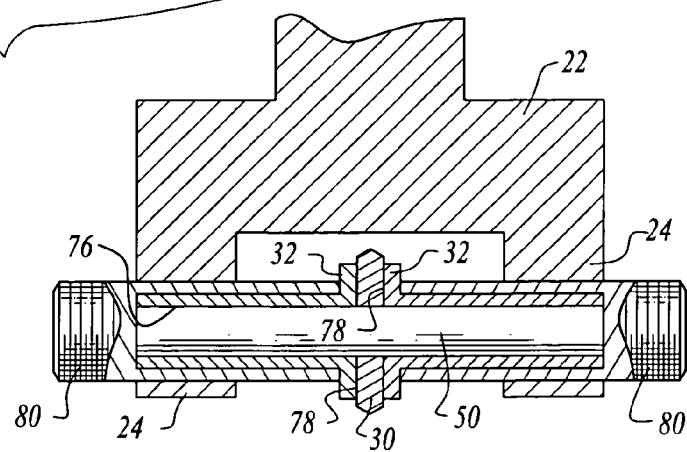
Fig. 12

SCRIBING SYSTEM WITH PARTICLE REMOVER

This is a continuation-in-part of application Ser. No. 11/041,841, filed Jan. 24, 2005.

TECHNICAL FIELD

This invention relates to the manufacture of semiconductor devices and circuits and more particularly to a tool and method for scribing semiconductor wafers in which particles of substrate material produced during the scribing operation are removed from the work site so that the do not interfere with proper operation of equipment at the work site.

BACKGROUND OF THE INVENTION

In the very early days of semiconductor device fabrication, the individual devices were separated from the other devices fabricated on the wafer by using the dicing process of scribing and breaking. The scribing process was carried out using a sharp-tipped diamond tool and initially done by hand. Later, automatic scribing machines such as those described in U.S. Pat. Nos. 3,094,785 and 5,820,006 were developed. These scribing machines provided a way to precisely position the diamond scribe tip as it traversed the width of the wafer and created the scribe line. This is necessary because the scribe line must stay within the scribe street that can be as narrow as 50 microns in width. Problems were observed with these scribe machines when hard semiconductor materials such as silicon were scribed. The diamond tips used in the machines would wear down quickly and have to be changed frequently at some expense. A new technology developed to dice these hard semiconductor materials using very thin saw blades made up of diamond particles embedded in a metal or resin matrix. Most silicon devices are currently diced using this sawing technology. The fact that the saw blade requires a wider scribe street due the width of the blade was generally not considered a problem, as silicon material is not too costly to produce. At this time, scribing with a sharp-tipped diamond tool is used primarily in niche applications in which the material is relatively soft so as not to cause a problem with diamond scribe tool life and in which the material is relatively expensive to produce. The materials that fit these criteria are generally compound semiconductors like gallium arsenide and indium phosphide.

For many decades, scribing and breaking of glass has been done using a wheel fabricated of steel or tungsten carbide. This wheel has an angle formed along its periphery that is pressed into the glass as it rolls along to create the scribe line. In the assembly of the scribe tool, the scribing wheel is mounted on an axle through a hole in its center. Then the axle and scribing wheel are placed in a tool body with holes on both sides to support the axle. The scribe tool is typically placed in a glass scribing machine similar to the one described in U.S. Pat. No. 4,221,150. In a glass scribing tool there are at least 50 to 100 microns clearance between the sides of the scribe of the scribe wheel and the inside of the yoke to allow the scribe wheel to turn freely. Therefore, when the scribe wheel tool traverses the glass to form the scribe line, the scribe wheel can move laterally back and forth between the inside edges of the yoke. This causes the scribe line to vary from a straight line by 50 to 100 microns. In glass scribing this variation is not considered a problem because the size of the scribed glass does not need to be held to any tighter tolerances.

In certain new types of semiconductor devices made out of silicon materials, the use of saws to dice wafers has proven to be unsatisfactory. In MEMS devices, the debris created by the sawing processing can prevent the mechanisms from operating properly. In very thin integrated circuits, such as those used in smart cards, the protruding diamond particles in the blade can cause chipping and fracturing of the device die. In trying to develop a process to dice these devices, conventional scribing using a sharp-tipped diamond tool was tried. While this approach solved the problem with debris and reduced chipping and fracturing, short diamond tool life when scribing a hard material like silicon is still a problem.

The purpose of the invention of above-identified application Ser. No. 11/041,841 is to achieve longer tool life, while maintaining the advantages of scribing over sawing in certain applications. The invention encompasses a new scribing tool and a new method of scribing semiconductor wafers employing the tool.

The scribing tool of above-identified application Ser. No. 11/041,841 is for use in semiconductor scribing apparatus for dicing semiconductor wafers. The scribing tool includes a tool body for movement relative to a semiconductor wafer, the tool body having a yoke with yoke legs defining a space therebetween.

A semiconductor wafer scribing wheel is located in the space having opposed scribing wheel sides an outer peripheral angularly disposed, converging scribed surfaces extending outwardly from the sides engageable with the semiconductor wafer to form scribed lines therein when the tool moves relative to the semiconductor wafer and exerts pressure thereon. The semiconductor wafer scribing wheel defines a central opening extending between the opposed scribing wheel sides.

An axle passes through the central opening and projects from the opposed scribing wheel sides, the axle cooperable with the yoke legs to rotatably support the semiconductor wafer scribing wheel within the space whereby the semiconductor wafer scribing wheel rotates when in engagement with the semiconductor wafer and the tool moves relative thereto.

Bearings are engageable with the opposed scribing wheel sides to resist sideways deflection of the semiconductor wafer scribing wheel during rotational engagement thereof with the semiconductor wafer.

The method of above-identified application Ser. No. 11/041,841 includes the step of supporting a semiconductor wafer on a support.

A scribing tool is positioned above the supported semiconductor wafer, the scribing tool including a tool body having a yoke with yoke legs defining a space therebetween, a semiconductor wafer scribing wheel in the space and an axle having a longitudinal axis extending between the yoke legs and supporting the semiconductor wafer scribing wheel for rotation about a rotational axis coaxial with the longitudinal axis.

The method also includes the step of bringing the semiconductor wafer scribing wheel into engagement with the semiconductor wafer.

Pressure is exerted on the semiconductor wafer with the semiconductor wafer scribing wheel.

While maintaining the pressure on the semiconductor wafer with the semiconductor wafer scribing wheel, relative movement is caused between the scribing tool and the semiconductor wafer to move the semiconductor wafer scribing wheel across a surface of the semiconductor wafer while rotating the semiconductor wafer scribing wheel about the rotational axis to form a scribe line in the semiconductor wafer.

During any dicing process of semiconductor wafers or similar substrates, including the process disclosed in application Ser. No. 11/041,841, small particles of the substrate material are sometimes created by the dicing tool cutting into the material of the substrate. In some types of devices these particles can cause problems in the functioning of the devices fabricated on the substrate. For example, MEMS devices may have intricate mechanisms fabricated on the surface of the substrate. Particles of material from the substrate can get into the mechanisms and prevent them from operating properly. Once particles are deposited on the surface of the substrate they may be held in place by static electricity and can be very difficult to remove without damaging the devices.

DISCLOSURE OF THE INVENTION

The problems just described are addressed by modifying the structure of the scribing tool and providing supplemental structure for effectively vacuuming loose particles and transporting them to another location.

The invention disclosed and claimed herein includes a scribing tool for use in semiconductor scribing apparatus for dicing semiconductor wafers. The scribing tool includes a tool body for movement relative to the semiconductor wafer and a scribing member held by the tool body and movable therewith relative to the semiconductor wafer while the scribing member is in engagement with the semiconductor wafer to form scribe lines in the semiconductor wafer.

Particle removal structure is operatively associated with the tool body and movable therewith for applying a vacuum to the surface of the semiconductor wafer engaged by the scribing member to remove particles from the surface and transport the particles to another location.

The invention also encompasses a method.

Other features, advantages and objects of the present invention will become apparent with reference to the following description and accompanying drawings.

BRIEF DESCRIPTION OF DRAWINGS

FIG. 5 is an exploded, perspective view of the tool;

FIG. 6 is a greatly enlarged, cross-sectional view illustrating components of the tool;

FIG. 7 is an enlarged, perspective view of the semiconductor wafer scribing wheel of the tool;

FIG. 8 is a greatly enlarged, cross-sectional view showing a portion of the scribing wheel including a central core and scribing wheel side layers attached to the core;

FIG. 9 is a view similar to FIG. 5, but illustrating a second embodiment of the tool;

FIG. 10 is a view similar to FIG. 6, illustrating the second tool embodiment;

FIG. 11 is a view similar to FIGS. 5 and 9, but illustrating a third embodiment of the invention;

FIG. 12 is a view similar to FIGS. 6 and 10, illustrating the components of the third embodiment tool;

MODES FOR CARRYING OUT THE INVENTION

Figure 1:
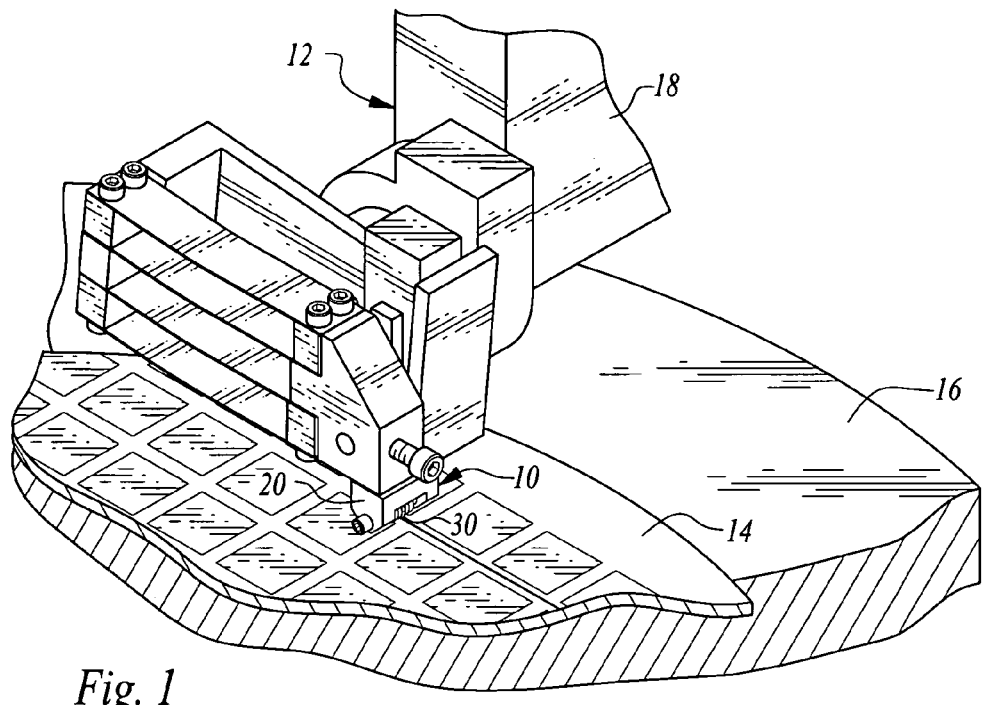
FIG. 1 is a perspective view of the scribing tool constructed in accordance with the teachings of the present invention incorporated in semiconductor scribing apparatus.
Figure 3:
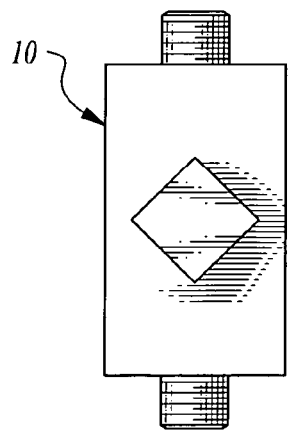
FIG. 3 is a top, plan view of the tool.
Figure 2:
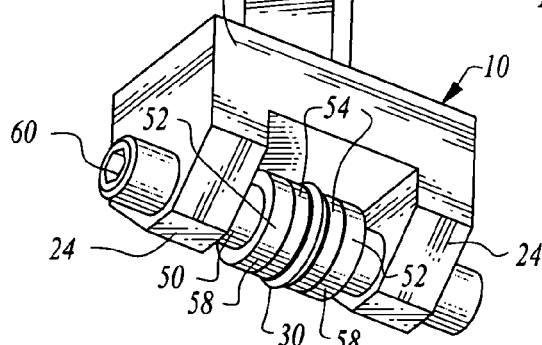
FIG. 2 is an enlarged, perspective view of the tool.
Figure 4:
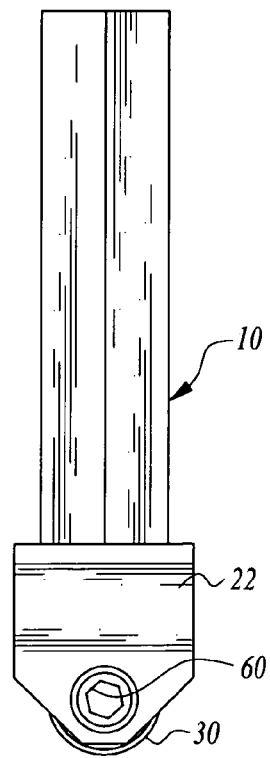
FIG. 4 is a side, elevational view of the tool.

FIGS. 1-8 illustrate a scribing tool constructed in accordance with the teachings of the present invention. The scribing tool is designated by reference numeral 10 and in FIG. 1 the scribing tool is shown employed in a semiconductor scribing apparatus 12 for dicing semiconductor wafers. One such wafer, semiconductor wafer 14, is illustrated. The wafer is located on a support 16.

U.S. Pat. No. 6,826,840, issued Dec. 7, 2004, discloses a scribe tool supported by a multi-stage gantry, the multi-stage gantry operable to selectively bring the scribe tool into engagement with the wafer and to move the scribe tool relative to the wafer while in engagement therewith to form a scribe line in the wafer.

The arrangement shown in FIG. 1 incorporates such a multi-stage gantry, the latter identified by reference numeral 18. It is to be appreciated, however, that the tool of the present invention may be utilized and the method of the present invention practiced utilizing any suitable type of scribing tool transport mechanism.

Scribing tool 10 includes a tool body 20 for movement relative to the semiconductor wafer 14. The tool body has a yoke 22 with yoke legs 24 defining a space therebetween.

A semiconductor wafer scribing wheel 30 is located in the space defined by the yoke legs, the scribing wheel having opposed scribing wheel sides 32 and outer peripheral angularly disposed, converging scribe surfaces 34 (see FIG. 7) extending outwardly from the sides engageable with the semiconductor wafer to form scribe lines, such as scribe line 36 shown in FIG. 1, therein when the tool moves relative to the semiconductor wafer and exerts pressure thereon. The semiconductor wafer scribing wheel defines a central opening 38 extending between the opposed scribing wheel sides.

The wheel employed when practicing this invention is a unique modification of a commercially available glass scribing wheel made available by Toyo Industrial Company Limited of Osaka, Japan. The unmodified commercially available wheel suitable for cutting glass is comprised of silicon carbide particles held together by a binder.

Scribing wheel 30 has a structure which may best be seen with reference to FIGS. 7 and 8. Scribing wheel 30 has an inner wheel core 40 of silicon carbide and binder scribing wheel side layers are affixed to the inner scribing wheel core 40. Each scribing wheel side layer is of multi-laminate construction, including an outer laminate 42 of nickel, chrome or other comparably hard metal and an inner layer 44, preferably of titanium. The titanium improves adhesion between the outer laminate 42 and the scribing wheel core. Shedding of abrasive silicon carbide particles is prevented at the sides of the scribing wheel core. The scribing edges on the periphery of the scribing wheel core are masked when being modified in accordance with the teachings of the present invention and a layer or laminate 44 of titanium a few microns thick is plated on the sides of the wheel. Then, on top of the layer of titanium, the outer laminate or layer of tough and resistant metal, such as nickel or chrome, is plated to a thickness of around 50 microns. The two scribing wheel sides are then lapped flat and parallel to a tolerance of from about 1 to 2 microns using conventioal lapping equipment.

An axle or shaft 50 passes through central opening 38 and projects from the opposed scribing wheel sides 32. The axle is cooperable with the yoke legs to rotatably support the semiconductor wafer scribing wheel within the space defined by the yoke legs whereby the semiconductor wafer scribing wheel rotates when in engagement with the semiconductor wafer and the tool moves relative thereto.

Bearings are engageable with the opposed scribing wheel sides to resist sideways deflection of the semiconductor wafer scribing wheel during rotational engagement thereof with the semiconductor wafer. In the arrangement of FIGS. 1-8, the bearings are identified by reference numeral 52. Each bearing is a rotary thrust bearing comprising a thrust bearing retainer 54, ball bearings 56 positioned in the thrust bearing retainer in engagement with a scribing wheel side and a thrust bearing plate 58 on a side of the ball bearings opposed to the scribing wheel side engaged thereby. The ball bearings are disposed in the two thrust bearing retainers and held in place during assembly by a light, inert grease, such as Krytox GPL 205 manufactured by DuPont Company. This grease also serves to lubricate the ball bearings during operation of the tool. After the scribing wheel 30 and the bearings 52 have been placed on the axle, the assembly is placed inside the yoke.

The tool includes bearing load adjustment structure in operative association with the bearings to move the bearings toward or away from the semiconductor wafer scribing wheel. In the arrangement of FIGS. 1-8, the bearing load adjustment structure comprises adjustment screws 60. A small amount of low-strength, thread locking compound, such as Loctite 222 is placed on the threads of the bearing load adjustment screws and the adjustment screws 60 are screwed into the two sides of the tool body, the ends of the axle being carefully guided into the cavities or holes 62 of the adjustment screws. The bearing load adjustment screws are then tightened to achieve the desired bearing clearance.

After assembly of the scribing tool is completed, it is mounted on a scribing machine such as that shown in FIG. 1 and identified by reference number 12.

The scribing process carried out using the new tool is considerably different from a similar process carried out using a sharp-tipped diamond tool. The scribe wheel tool has a much larger contact area with the surface of the wafer than the sharp-tipped diamond tool point. This allows the application of increased force to the surface of the wafer resulting in the creation of stress much deeper in the wafer without creating surface damage. This gives a scribe line with less chipping due to damage on the surface of the wafer and a scribe line that is easier to break due to an increase in the amount and the depth of stress in the body of the wafer under the scribe line.

The process parameters to achieve the best scribing results depend on the diameter of the scribing wheel, the angle of the wheel's scribe surfaces 34, the amount of force applied to the tool by the scribing machine, and the material being scribed. For silicon material, the wheel size can range from about 2 mm to about 10 mm in diameter with the larger wheels requiring more force to achieve the desired results. The angles of the wheel's scribe surfaces can vary from around 80 degrees to around 150 degrees. In tests best results on silicon using a 4 mm diameter wheel were obtained using wheels with angles of 140 degrees to 150 degrees and a force of 350-400 grams.

A further advantage of the new tool is that the scribing can be carried out at a higher velocity than with a sharp-tipped diamond tool. Conventional diamond scribers are usually limited to a velocity of around 100 mm/sec. Tests have shown that the scribing tool of this invention will scribe at velocities of at least 800 mm/sec.

The method of the invention includes the step of supporting a semiconductor wafer on a support.

A scribing tool is positioned above the supported semiconductor wafer, the scribing tool including a tool body having a yoke with yoke legs defining a space therebetween, a semiconductor wafer scribing wheel in the space and an axle having a longitudinal axis extending between the yoke legs and supporting the semiconductor wafer scribing wheel for rotation about a rotational axis co-axial with the longitudinal axis.

The semiconductor wafer scribing wheel is brought into engagement with the semiconductor wafer.

Pressure is exerted on the semiconductor wafer with the semiconductor wafer scribing wheel. While maintaining the pressure on the semiconductor wafer with the semiconductor wafer scribing tool, relative movement is caused between the scribing tool and the semiconductor wafer to move the semiconductor wafer scribing wheel across a surface of the semiconductor wafer while rotating the semiconductor wafer scribing wheel about the rotational axis to form a scribe line in the semiconductor wafer.

Opposed sides of the semiconductor wafer scribing wheel are engaged with bearings to resist sideways deflection of the semiconductor wafer scribing wheel.

The semiconductor wafer scribing wheel is adjustably moved to a desired predetermined location relative to the yoke prior to bringing the semiconductor wafer scribing wheel into engagement with the semiconductor wafer. Movement of the semiconductor wafer scribing wheel is accomplished by changing positions of the bearings relative to the yoke.

FIGS. 9 and 10 show an alternative embodiment of the invention. The axle 50 is inserted through the central opening 38 in the scribing wheel 30. The ball bearings 56 are placed into ball bearing plates 70 and held in place during assembly by a light, inert grease, such as Krytox GPL 205 manufactured by DuPont Company. In addition, this grease serves to lubricate the ball bearings during operation of the tool. The two ball bearing plates 70, with the ball bearings 56 are placed on the axle 50 on both sides of the semiconductor wafer scribing wheel 30. This assembly is placed inside the yoke 22 of the tool body. A small amount of low-strength, thread locking compound, such as Loctite 222, is placed on the threads of the bearing load adjustment screws 72. The bearing load adjustment screws are screwed into the two sides of the tool body and the ends of the axle are carefully guided into the cavities in the ends of the bearing load adjustment screws. Finally, the bearing load adjustment screws are tightened to achieve the desired bearing clearance.

FIGS. 11 and 12 illustrate a third embodiment of the scribing tool. In this embodiment, double-ended bushings 76 are positioned on and surround the axle 50. The bushings have scribing wheel side engagement surfaces 78 at the inner, opposing ends thereof. Adjustment screws 80 surround the bushings 76 and are threadedly engaged with the yoke legs 24. A small amount of low-strength, thread locking compound, such as Loctite 222, is placed on the threads of the adjustment screws prior to threaded engagement with the yoke legs. The adjustment screws are tightened to achieve the desired clearance between the double-ended bushings 76 and the scribing wheel 30.

Figure 13:
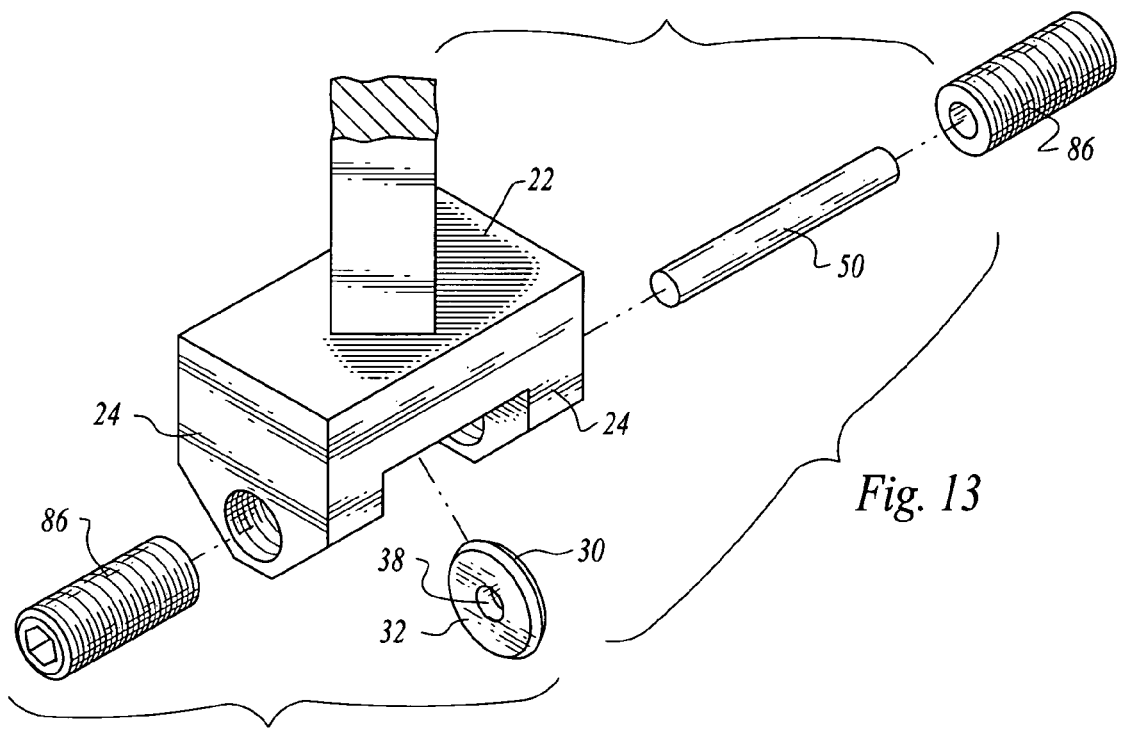
FIG. 13 is an exploded, perspective view of a fourth embodiment of the tool.
Figure 14:
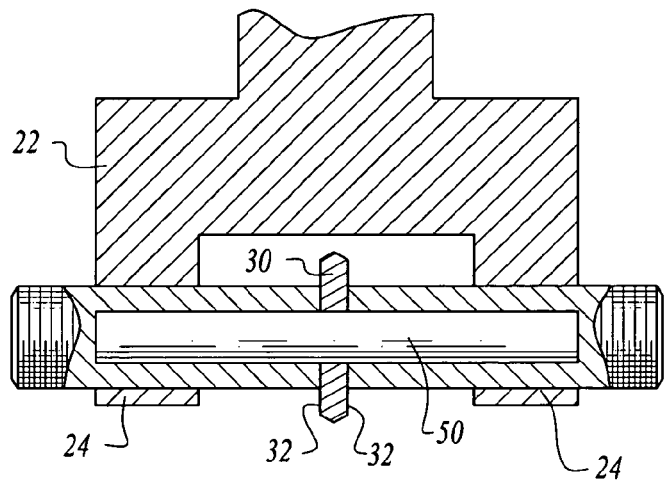
FIG. 14 is an enlarged, cross-sectional view of the components of the fourth tool embodiment.

FIGS. 13 and 14 show a fourth scribing tool embodiment. In this embodiment threaded double-ended bushings 86 are employed and surround the axle 50 on opposed sides of the scribing wheel 30. The bushings 86 are threadedly engaged with the yoke legs 24 and the inner ends of the bushings constitute bearing surfaces engageable with the sides of the scribe wheel. A socket opening is defined at the outermost ends of the bushings 86 to allow adjustment in the positioning thereof. A small amount of low-strength, thread locking compound is preferably applied to the threads of the bushings 86 prior to threading engagement with the yoke to maintain the bushings and scribing wheel in position.

Figures 15, 16, 17:
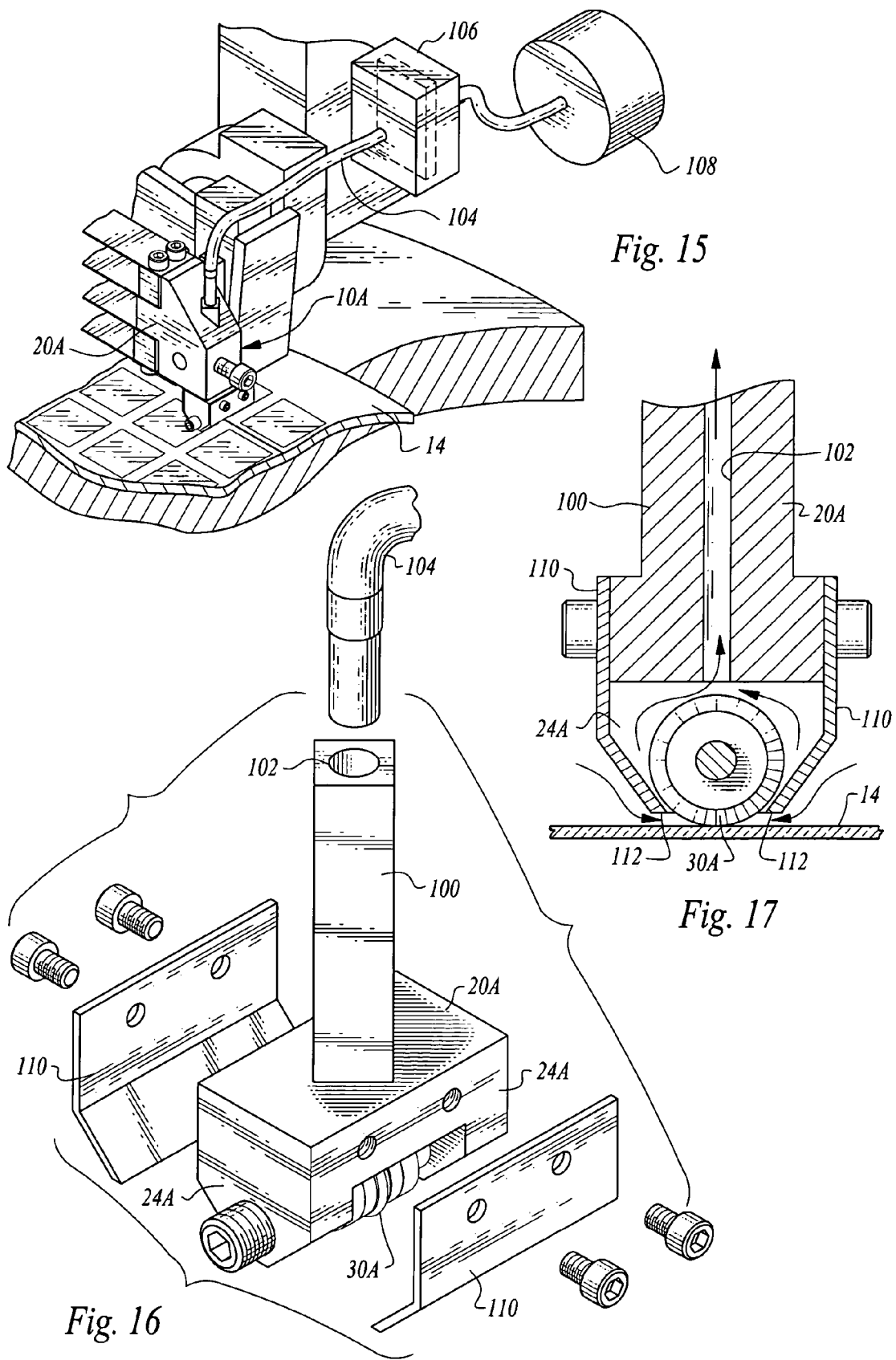
FIG. 15 is a perspective view illustrating a scribing tool positioned over a semiconductor wafer and particle removal structure constructed in accordance with the teachings of the present invention connected to the tool body of the scribing tool.
FIG. 16 is an enlarged, perspective, exploded view showing selected components of the scribing tool modified in accordance with the teachings of the present invention and structural components of the particle removal structure.
FIG. 17 is an enlarged, cross-sectional view illustrating air flow through components of the invention during operation thereof.

FIGS. 15, 16 and 17 show a scribing tool 10A which is essentially identical to scribing tool 10 shown in FIGS. 1-8, except as will be indicated below. Scribing tool 10A includes a tool body 20A for movement relative to the semiconductor wafer 14. Tool body 20A has a yoke with yoke legs 24A defining a space therebetween.

A scribing member in the form of a scribing wheel 30A is located in the space. The scribing wheel has an outer peripheral cutting edge. The scribing wheel is held by the tool body and movable therewith relative to the semiconductor wafer while the scribing wheel is in engagement with the semiconductor wafer, as shown in FIG. 17, to form scribe lines in the semiconductor wafer.

The shaft 100 of the tool body has a throughbore 102 formed therein, the bottom of the throughbore being in fluid flow communication with the space between the yoke legs 24A.

A conduit 104 from the upper end of the throughbore leads to a particle collector 106 of any suitable type. A vacuum source in the form of a vacuum pump 108 creates a vacuum which causes an air flow from the tool body space through throughbore 102 and conduit 104 and thence through collector 106 wherein a filter collects any particles entrained in the air flow.

The particle removal structure of the invention further includes a pair of shields 110 which are connected to the front and rear of the tool body, suitably by threaded fasteners. The shields 110 partially cover the space between the legs 24A of the tool body. The shields are located away from one another and have shield distal ends 112 spaced from the upper surface of the semiconductor wafer, i.e. the surface engaged by the scribing wheel.

The shield distal ends 112 are also closely adjacent to the outer peripheral cutting edge of the scribing wheel at opposed locations. Lower portions of the shields terminating at the shield distal ends incline inwardly as shown.

The distal ends of the shields 110 define with the upper surface of the semiconductor wafer restricted openings for promoting a vacuum induced, high velocity flow of air into the space defined by the tool body.

Clean-up and removal of particles such as those produced by the scribing process is highly effective. Contributing to this result is the fact that the restricted openings defined by the distal ends of the shields and the top surface of the semiconductor wafer results in air flowing through the restricted openings from opposite directions, ensuring that the particles are entrained and conveyed as indicated by the arrows in FIG. 17.

The invention claimed is:

1. A method for scribing a semiconductor wafer or other microelectronic substrate workpiece, said method comprising the steps of:
    supporting a microelectronic substrate workpiece on a support;
    positioning a scribing tool adjacent to a surface of the supported workpiece, said scribing tool including a tool body and a scribing member held by said tool body;
    moving said tool body and scribing member to bring said scribing member into engagement with the surface;
    exerting pressure on said workpiece with said scribing member at said surface;
    while maintaining pressure on said workpiece with said scribing member, causing relative movement between said scribing tool and said workpiece to form a scribe line in said workpiece while maintaining said tool body spaced from said surface; and
    during formation of said scribe line, applying a vacuum to said surface to create a vacuum induced, high velocity airflow in the immediate vicinity of the surface of said workpiece between the tool body and the surface of said workpiece and past said scribing member to entrain and remove particles produced by scribing by said scribing tool from the surface and transport said removed particles to a selected location spaced from said workpiece, said tool body defining a space and said scribing member being in said space and projecting outwardly therefrom, said method additionally including the step of partially covering said space with at least one shield connected to said tool body and having a distal end whereby the distal end of said shield and the surface are cooperable to form a restricted opening and the further step of utilizing said vacuum to produce said vacuum induced, high velocity air flow through said restricted opening into said space.

2. The method according to claim 1 including the steps of providing an air flow passageway through said tool body leading from said space and utilizing a vacuum source to cause air flow through said air flow passageway from said space.

3. The method according to claim 1 wherein said space is partially covered by two shields having distal ends, the distal ends of said two shields being spaced from one another and positioned closely adjacent to said surface and forming two restricted openings disposed on opposed sides of said scribing member, said vacuum producing opposed air flows through said restricted openings.

4. The method according to claim 3 wherein said scribing member comprises a scribing wheel having an outer peripheral cutting edge, said method including positioning said shield distal ends closely adjacent to said outer peripheral cutting edge at opposed locations with the distal ends of said shields defining said restricted openings with said surface, the method further including the step directing air passing through the restricted openings in opposite directions said scribing wheel prior to exiting said space.

5. In combination:
    a scribing tool for use in scribing apparatus for dicing a semiconductor wafer or other microelectronic substrate workpiece, said scribing tool including a tool body for movement relative to a microelectronic substrate workpiece and a scribing member held by said tool body and movable therewith relative to said workpiece while the scribing member is in engagement with a surface of said workpiece to form scribe lines in said workpiece, said tool body defining a space and said scribing member partially disposed in said space and projecting outwardly therefrom beyond said tool body when in engagement with said workpiece; and
    particle removal structure connected to said tool body and movable therewith for applying a vacuum to the surface of said workpiece engaged by said scribing member to create a vacuum induced, high velocity air flow at said surface between said tool body and said surface and past said scribing member to entrain and remove particles from the immediate vicinity of said surface caused by scribing of the workpiece by said scribing member and transport the removed particles to a location spaced from said surface, said particle removal structure including at least one shield attached to said tool body and partially covering said space, said at least one shield extending downwardly from said tool body and having a shield distal end positioned closely adjacent to and spaced from said surface and defining therewith a restricted opening promoting said vacuum induced, high velocity air flow.

6. The combination according to claim 5 wherein said particle removal structure includes a pair of shields attached to said tool body and partially covering said space and extending downwardly from said tool body, the shields of said pair of shields being located a fixed distance away from one another and having shield distal ends positioned closely adjacent to and spaced from said surface and defining therewith two spaced restricted openings promoting said vacuum induced, high velocity air flow, said vacuum induced high velocity air flow passing through the two spaced restricted openings from opposite directions toward said scribing member.

7. The combination according to claim 6 wherein said scribing member comprises a scribing wheel having an outer peripheral cutting edge, said shields extending along opposed sides of said outer peripheral cutting edge and said shield distal ends being closely adjacent to said outer peripheral cutting edge at opposed locations, said shields including inwardly inclined shield lower portions terminating at said distal ends, said shield lower portions extending toward one another and said distal ends thereof located under opposed portions of said scribing wheel.

8. The combination according to claim 5 wherein said particle removal structure additionally comprises a vacuum source in fluid flow communication with said space defined by said tool body.

9. The combination according to claim 8 wherein said tool body defines an air flow passageway leading from said space and in fluid flow communication with said vacuum source.

* * * * *